(12) United States Patent
Huang et al.

(10) Patent No.: US 10,073,503 B2
(45) Date of Patent: Sep. 11, 2018

(54) PORTABLE ELECTRONIC DEVICE

(71) Applicant: Acer Incorporated, New Taipei (TW)

(72) Inventors: Pao-Min Huang, New Taipei (TW); Chi-Hung Lai, New Taipei (TW); Chia-Bo Chen, New Taipei (TW); Wu-Chen Lee, New Taipei (TW); Cheng-Mao Chang, New Taipei (TW); Chien-Yuan Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days.

(21) Appl. No.: 15/654,734

(22) Filed: Jul. 20, 2017

(65) Prior Publication Data

US 2018/0173282 A1    Jun. 21, 2018

(30) Foreign Application Priority Data

Dec. 15, 2016   (JP) .................................. 105141552 A

(51) Int. Cl.
*G06F 1/20* (2006.01)
*F28D 15/02* (2006.01)
*H01L 23/427* (2006.01)

(52) U.S. Cl.
CPC ......... *G06F 1/203* (2013.01); *F28D 15/0233* (2013.01); *H01L 23/427* (2013.01); *G06F 2200/203* (2013.01)

(58) Field of Classification Search
CPC ................ F28D 15/0233; G06F 1/203; G06F 2200/203; G06F 1/168; G06F 1/1662; G06F 1/166; G06F 1/1616; G06F 1/1681; H01L 23/427; E05D 11/06; E05D 11/1014; E05D 11/1028; E05D 2011/1092; E05F 3/20; E05F 5/006
USPC .......... 361/679.47, 679.12, 657.55; 439/625; 16/319, 223, 231, 374, 366, 369, 277, 16/233, 327, 341, 348, 351, 360
See application file for complete search history.

(56) References Cited

U.S. PATENT DOCUMENTS

| | | | |
|---|---|---|---|
| 2013/0225001 A1* | 8/2013 | Chang | ..................... G06F 1/166 439/625 |
| 2015/0153793 A1* | 6/2015 | Hsu | ......................... G06F 1/203 361/679.47 |

* cited by examiner

*Primary Examiner* — Mandeep S Buttar
(74) *Attorney, Agent, or Firm* — JCIPRNET

(57) ABSTRACT

A portable electronic device including a first body, a second body, a cam, and a linking rod is provided. The first body has a reaming hole. The second body has a rotating shaft movably coupled to the reaming hole in pivoting and penetrating manner. The cam is assembled to a side surface of the rotating shaft to rotate along with the rotating shaft. The linking rod has a first end and a second end opposite to each other. The first end is pivoted to the cam, and the second end is pivoted to the first body. When the second body is pivoted relative to the first body via the rotating shaft, the cam rotates along with the rotating shaft and the linking rod drives the cam and the rotating shaft to move along the reaming hole so as to move the second body towards or away from the first body.

7 Claims, 6 Drawing Sheets

PORTABLE ELECTRONIC DEVICE

CROSS-REFERENCE TO RELATED APPLICATION

This application claims the priority benefit of Taiwan application serial no. 105141552, filed on Dec. 15, 2016. The entirety of the above-mentioned patent application is hereby incorporated by reference herein and made a part of this specification.

BACKGROUND

Field of the Disclosure

The disclosure relates to a portable electronic device.

Description of Related Art

Nowadays, in order to prevent overheating of high power electronic components, such as microprocessor, graphics processing unit, etc., heat dissipating devices (such as fan) are installed to reduce the temperature thereof, and clamshell-type electronic devices (such as notebook computer) are not an exception. Simultaneously, in order to avoid the outlets of the fan facing the user or the hands of the user when the user operates a notebook computer, the outlets of the fan are generally disposed at the back of the main frame so that the hot air is not directly blown towards the user.

On the other hand, along with the need for electronic devices to become thinner, the clamshell-type electronic device is designed so that a part of the clamshell is moved to the back of the main frame after the display serving as the clamshell is open from the main frame via an axle structure, so as to reduce the thickness and achieve artistic effect of the main frame. However, the aforementioned design of the clamshell-type electronic device interferes with disposition of the heat dissipating device. In other words, after the clamshell is open, the part of the clamshell at the back of the main frame blocks the outlets of the fan so as to obstruct the heat dissipating process.

Based on the above, how to achieve both artistic effect of thin device and heat dissipation efficiency is indeed an imperative issue to be solved by relevant personnel.

SUMMARY

The disclosure provides a portable electronic device having a body capable of pivoting towards or away from another body through an axle structure.

The portable electronic device of the disclosure includes a first body, a second body, a cam, and a linking rod. The first body has a reaming hole. The second body has a rotating shaft movably coupled to the reaming hole in a pivoting and a penetrating manner. The cam is assembled to a side surface of the rotating shaft to rotate along with the rotating shaft coaxially. The linking rod has a first end and a second end opposite to each other. The first end is pivoted to the cam, and the second end is pivoted to the first body. When the second body is pivoted relative to the first body via the rotating shaft, the cam rotates along with the rotating shaft and the linking rod drives the cam and the rotating shaft to move along the reaming hole so as to move the second body towards or away from the first body.

Based on the above, in the portable electronic device, the rotating shaft of the second body is movably coupled to the reaming hole of the first body in a pivoting manner, and the cam and one end of the linking rod are further assembled to the side surface of the rotating shaft. Simultaneously, another end of the linking rod is pivoted to a stationary part of the first body. Accordingly, when the second body is pivoted relative to the first body via the rotating shaft, one end of the linking rod pivoted to the cam moves along with the cam, and another end of the linking rod pivoted to the stationary part of the first body is unable to move. Therefore, the first body and the second body are moved relative to each other via moving the rotating shaft or pivoting the second body. In addition, the bodies in the portable electronic device are simultaneously pivoted and moved relative to each other, so as to achieve appearance change and incorporate corresponding functions.

In order to make the aforementioned and other features and advantages of the disclosure more comprehensible, embodiments accompanying figures are described in detail belows.

DESCRIPTION OF THE EMBODIMENTS

Figure 1:
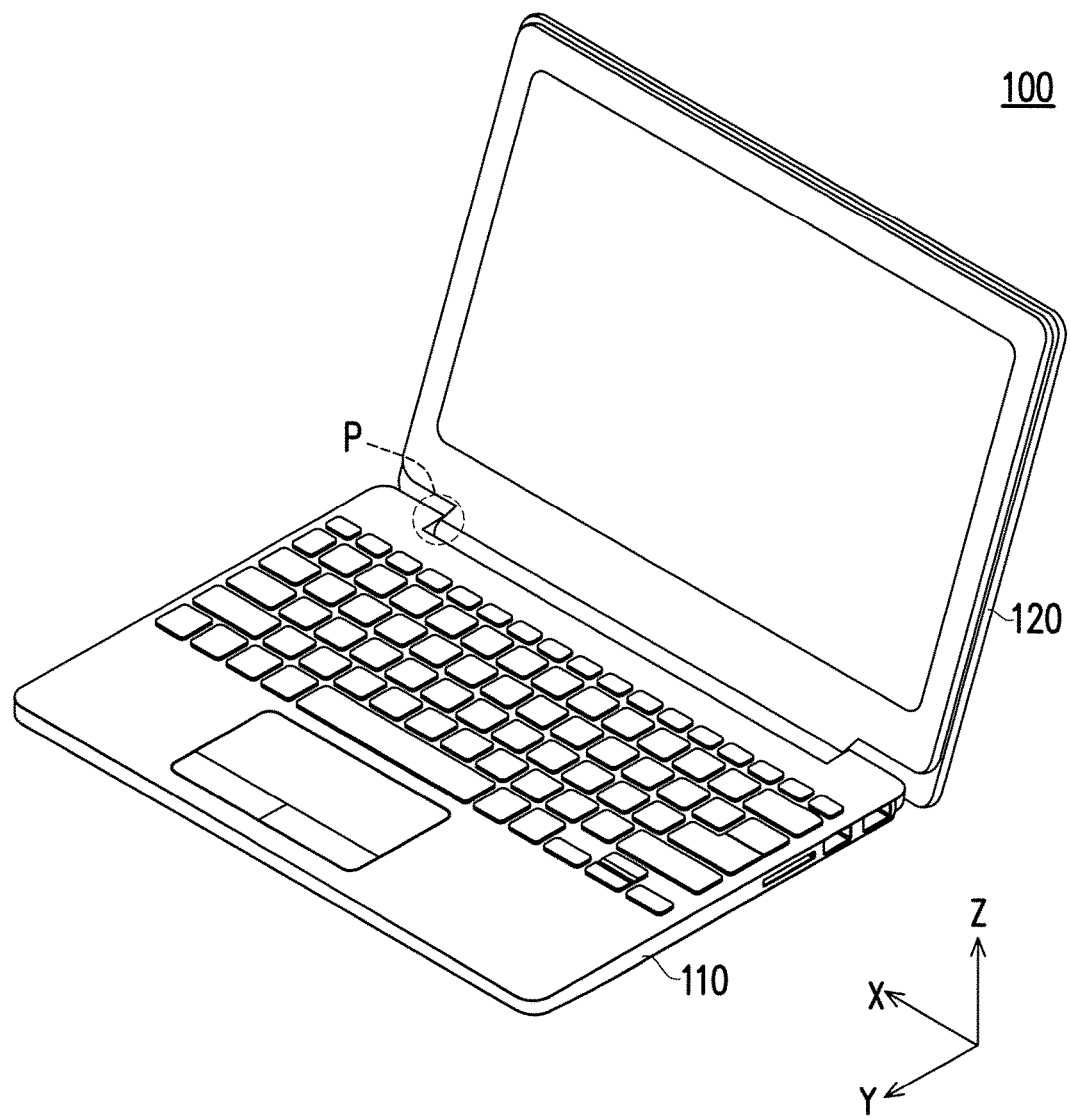
FIG. 1 is a schematic view of a portable electronic device according to one embodiment of the disclosure.

FIG. 1 is a schematic view of a portable electronic device according to one embodiment of the disclosure. Referring to FIG. 1, in the present embodiment, a portable electronic device 100, such as a notebook computer, includes a first body 110 (such as a host), a second body 120 (such as a display), and an axle structure. The axle structure is configured to make the first body 110 and the second body 120 pivot relative to each other and to make the first body 110 and the second body 120 move relative to each other, in order to change the relative positions of the bodies, to change appearance of the bodies, and to achieve some specific functions. In addition, the components forming the axle structure are respectively disposed inside the first body 110 and the second body 120. Only a part of the axle structure is shown in FIG. 1 as a portion P and will be further described hereinafter.

Figure 2:
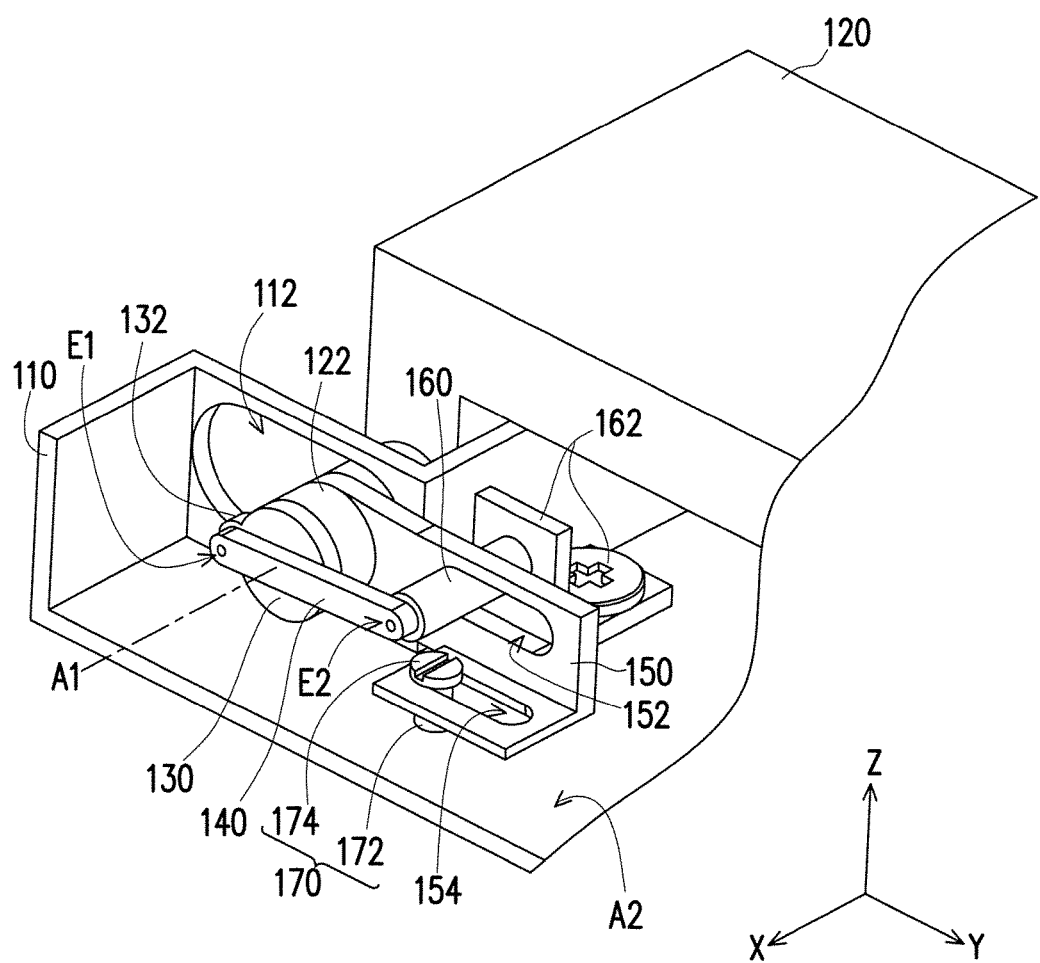
FIG. 2 to FIG. 4 are partial schematic views of the portable electronic device in FIG. 1 at different states.
Figure 3:
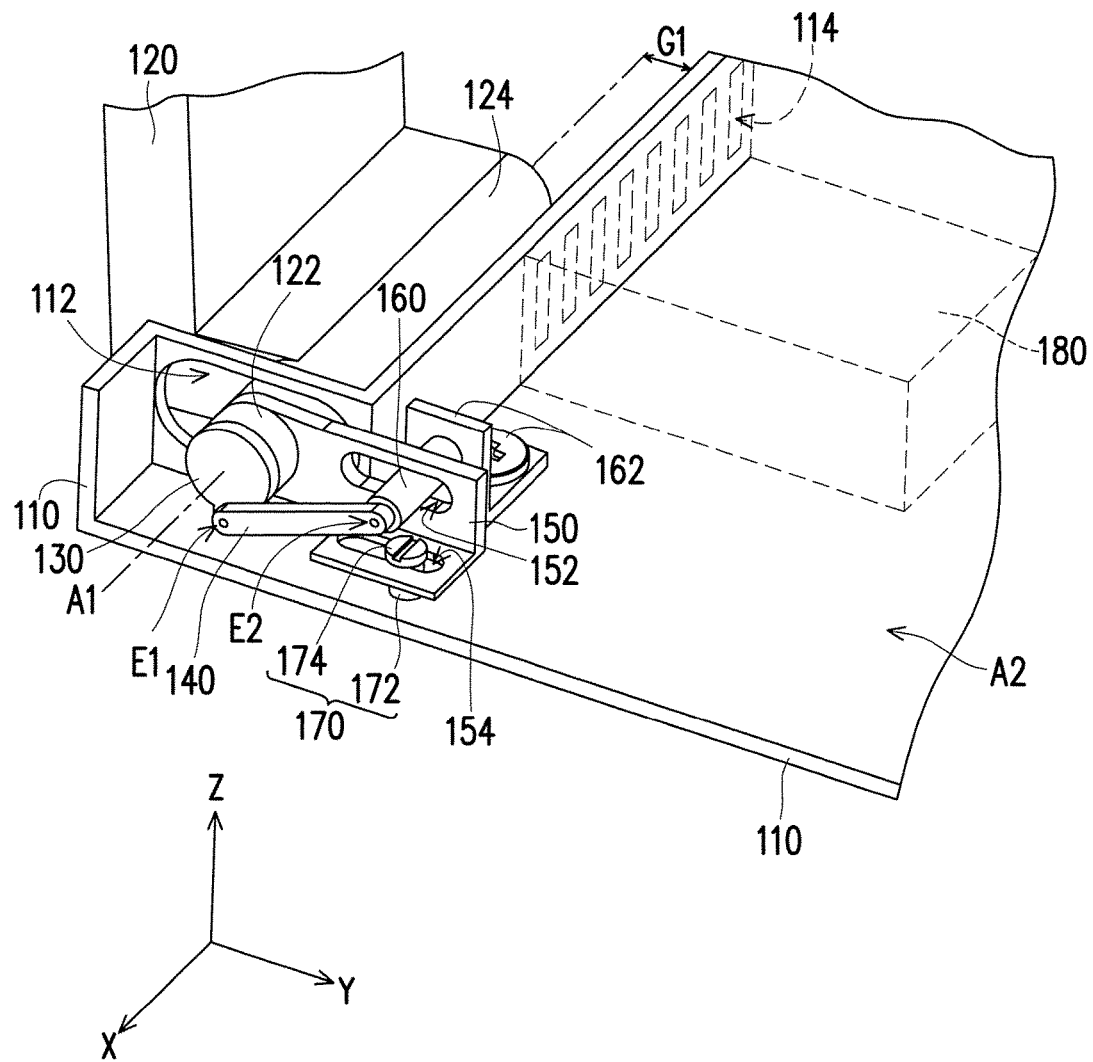
Figure 4:
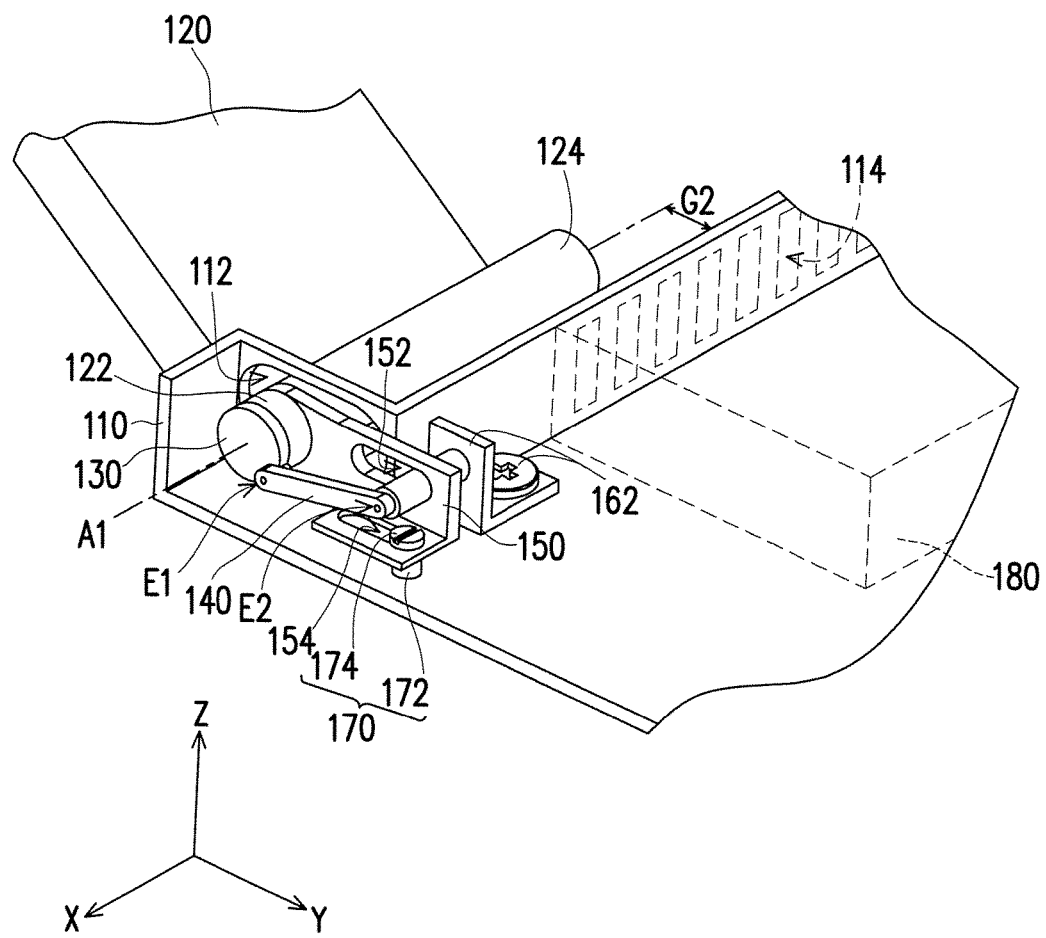

FIG. 2 to FIG. 4 are partial schematic views of the portable electronic device in FIG. 1 at different states and depict the components inside the portion P of the portable electronic device 100 shown in FIG. 1. In addition, a state shown in FIG. 4 is corresponding to FIG. 1 and is a fully-open state of the portable electronic device 100, and the angle that the portable electronic device 100 is open is not limited in the disclosure. FIG. 2 depicts the portable electronic device 100 at a fully-closed state, and FIG. 3 depicts a state between the fully-closed state and the full-open state of the portable electronic device 100. Simultaneously, the present embodiment provides Cartesian coordinates in order to describe the components easier. Furthermore, FIG. 2 to FIG. 4 only depict some of the components in three dimensions, and the first body 110 and the second body 120 are cut by different sectional planes so as to identify the components easier.

Referring FIG. 2 to FIG. 4 simultaneously, in the present embodiment, the first body 110 has a reaming hole 112, the second body 120 has a rotating shaft 122, and the rotating shaft 122 is movably coupled to the reaming hole 112 in a pivoting and a penetrating manner. Furthermore, the portable electronic device 100 further includes a cam 130 and a linking rod 140, and the cam 130 is assembled to a side surface of the rotating shaft 122 to rotate along with the rotating shaft 122 coaxially. Thus, the rotating shaft 122 is rotated about a center A1 so that the second body 120 is opened from or closed to the first body 110, and the axis A1 is substantially parallel to the X-axis. Simultaneously, the cam 130 is driven to rotate about the axis A1. The linking rod 140 has a first end E1 and a second end E2 opposite to each other, the first end E1 is pivoted to the cam 130, and the second end E2 is pivoted to a stationary part of the first body 110. That is, the second end E2 of the linking rod 140 is only rotated relative to the first body 110 on the Y-Z plane (or other planes parallel to the Y-Z plane), and the displacement of the second end E2 with respect to the first body 110 cannot happen.

Based on aforementioned structure, when the second body 120 is pivoted relative to the first body 110 via the rotating shaft 122, the cam 130 rotates along with the rotating shaft 122 and the linking rod 140 drives the cam 130 and the rotating shaft 122 to move (in and) along (an extending axis of) the reaming hole 112 so as to move the second body 120 towards or away from the first body 110. FIG. 2 to FIG. 4 depict a process of the second body 120 moving away from the first body 110. In contrast, FIG. 4 to FIG. 2 depict a process of the second body 120 moving towards the first body 110.

In detail, the portable electronic device 100 of the present embodiment further includes a moving member 150 and a first stationary axle 160 that are fixed to the rotating shaft 122 and located inside the first body 110, and the moving member 150 has a first guiding slot 152. The first stationary axle 160 is fixed inside the first body 110 through structural members 162, the first stationary axle 160 and the first guiding slot 152 are movably coupled to each other, and an extending direction of the first guiding slot 152 and an extending direction of the reaming hole 112 are identical. That is, the aforementioned extending directions all are parallel to the Y-axis, so the moving member 150 moves along the Y-axis. In addition, the first end E1 of the linking rod 140 is pivoted to a convex portion 132 of the cam 130, and the second end E2 of the linking rod 140 is pivoted to the first stationary axle 160. Accordingly, the first stationary axle 160 is extended along the X-axis (the positive direction of X-axis) to pass through the first guiding slot 152 in order to be pivotally connected with the second end E2 of the linking rod 140.

Speaking of the linking rod 140, since the second end E2 is essentially fixed to the first body 110 (or pivoted to the stationary part of the first body 110, such as the first stationary axle 160), when the first end E1 of the linking rod 140 is rotated along with the convex portion 132 of the cam 130, a connection portion of the convex portion 132 and the first end E1 is moved towards or away from another connection portion of the second end E2 and the first stationary axle 160. Further, the linking rod 140 is a rigid body, the distance between the first end E1 and the second end E2 is constant, and only the moving member 150 and the rotating shaft 122 (these two components may be considered as one component) move in the reaming hole 112 and the first guiding slot 152. Therefore, the movement towards or away from of the connection portions causes the moving member 150 and the rotating shaft 122 to move relative to the first body 110, which is also needed for the connection portion of the first end E1 and the convex portion 132 to move towards or away from the another connection portion of the second end E2 and the first stationary axle 160 smoothly. In other words, when the second body 120 and the rotating shaft 122 are rotated, the cam 130 and the linking rod 140 are driven (the second body 120 and the rotating shaft 122 may be moved simultaneously) to achieve the effect of moving by reaction force.

Accordingly, when the second body 120 is folded to (or closed to) the first body 110, the axis A1 of the rotating shaft 122 is substantially located between the first end E1 and the second end E2, as shown in FIG. 2. When the second body 120 is unfolded from (or open from) the first body 110, the first end E1 is substantially located between the axis A1 of the rotating shaft 122 and the second end E2, as shown in FIG. 4.

Referring to FIGS. 3 and 4 and comparing to FIG. 2, in the present embodiment, the portable electronic device 100 further includes a heat dissipation component (such as a fan 180), and the side surface of the first body 110 further has a plurality of outlets 114 that face the outlet of the fan 180. Because each of the reaming hole 112 and the first guiding slot 152 is extended along the Y-axis, the rotating shaft 122 and the second body 120 are displaced/moved in the pivoting process. In the state of FIG. 3, a gap G1 is formed between a side portion 124 of the second body 120 and the outlets 114 on the side surface of the first body 110. Similarly, when the second body 120 continues being unfolded from (open from) the first body 110, a gap G2 is formed between the side portion 124 of the second body 120 and the outlets 114 on the side surface of the first body 110, and the gap G2 is greater than the gap G1. In other words, the side portion 124 of the second body 120 and the fan 180 are corresponding to each other and separated by the side surface of the first body 110 but the gap G1 or G2 is formed in pivoting process of the bodies, so that the cooling air flow after absorbing heat is blown by the fan 180 through the outlets 114 and then is smoothly discharged from the first body 110, so as to achieve a better heat dissipation efficiency.

On the other hand, the moving member 150 in the present embodiment further has a second guiding slot 154, and the portable electronic device 100 further includes a second stationary axle 170 fixed to the first body 110. The second guiding slot 154 and the second stationary axle 170 are movably coupled to each other, the extending direction of the second guiding slot 154 and the extending direction of the first guiding slot 152 are identical (i.e., both components are extended along the Y-axis), and the second stationary axle 170 (extended along the Z-axis) is orthogonal to the first stationary axle 160 (extended along the X-axis). Further, the second stationary axle 170 includes a connecting portion 172 and a top blocker 174, and the connecting portion 172 passes through the second guiding slot 154 and is fixed between a reference surface A2 of the first body 110 and the top blocker 174. In the present embodiment, the outer diameter of the top blocker 174 is substantially greater than the X-axis direction width of the second guiding slot 154, so the top blocker 174 presses onto a portion of the moving member 150 at the second guiding slot 154, so as to achieve an effect of limiting the moving member 150 in the Z-axis. In other words, in the process of the moving member 150 moving along the Y-axis, the top blocker 174 may provide a binding force in the Z-axis. When the moving member 150 moves along with the pivoting process of the second body 120 and the rotating shaft 122 relative to the first body 110, the moving member 150 is prevented from falling off or being flipped/tilted (in the process of unfolding the bodies, the rotating shaft 122 is essentially moved away from the pivoting point of the linking rod 140 and the first stationary axle 160, it represents that the moment arm of the second body 120 and the rotating shaft 122 with respect to the pivoting point is gradually increased to cause an increment of torsion, so the second stationary axle 170 is used to fix the moving member 150 to the first body 110 in order to cancel the increment of torsion, so as to achieve the desired effect). Simultaneously, if the second body 120 is a touch panel, the second body 120 will be prevented from wobbling when the user operates the touch panel.

Figure 5:
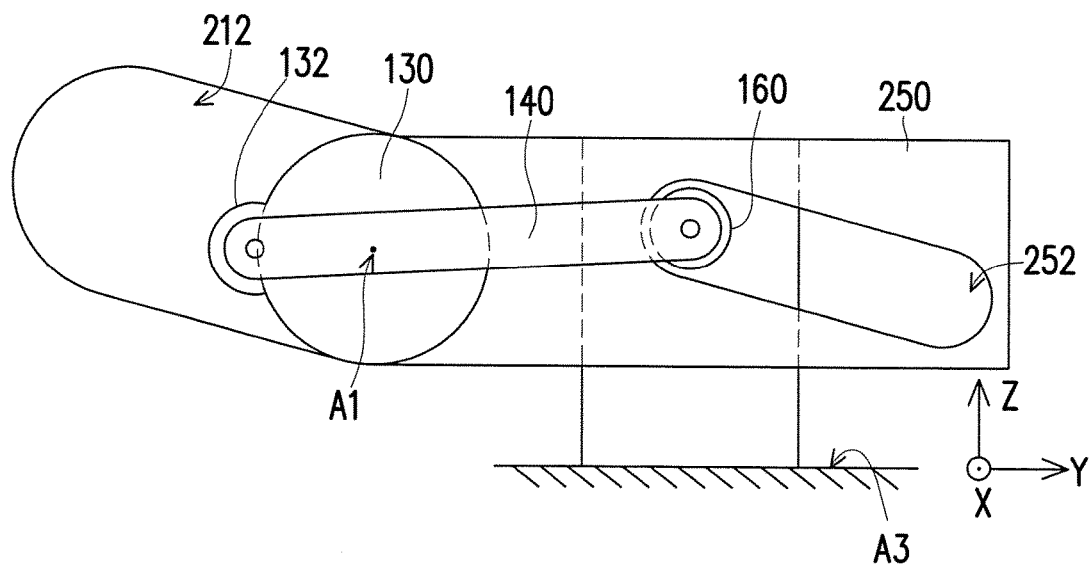
FIG. 5 and FIG. 6 are equivalent schematic views of an axle structure of a portable electronic device according to other embodiments of the disclosure, respectively.
Figure 6:
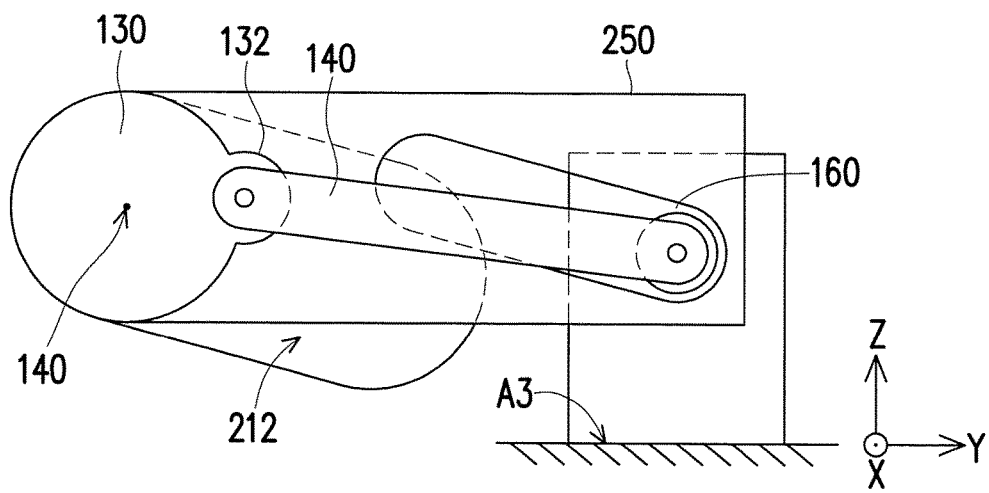

FIG. 5 and FIG. 6 are equivalent schematic views of an axle structure of a portable electronic device according to other embodiments of the disclosure, respectively. The change in state of the axle structure is depicted from a viewing angle in the negative direction of the X-axis shown in FIG. 2 to FIG. 4, the components with the same reference numbers in different embodiments are the same and will not be repeatedly described. Referring to FIG. 5 and FIG. 6 simultaneously, the differences between the present embodiment and the embodiment in FIGS. 2-4 are described as followings. In the embodiment of FIGS. 2-4, the reaming hole 112 and the first guiding slot 152 are both extended along the Y-axis. However, in the present embodiment of FIGS. 5-6, the extending direction of the reaming hole 212 and the extending direction of the first guiding slot 252 has a same slope with respect to a reference surface A3 of the first body, so that when the second body is unfolded from the first body, the second body is simultaneously lifted relative to the reference surface A3 (parallel to X-Y plane). As shown in the pivoting process of the bodies in FIG. 5 to FIG. 6 (corresponding to FIG. 2 to FIG. 4), the moving member 250 and the rotating shaft not only displace/move along the Y-axis but also displace/move along the Z-axis. Therefore, in the pivoting process of the bodies, other structural appearance variations may be achieved, so as to increase flexibility when operating the portable electronic device to attract the user. The design of the slope is not limited in the disclosure and is determined according to structural requirements.

Figure 7:
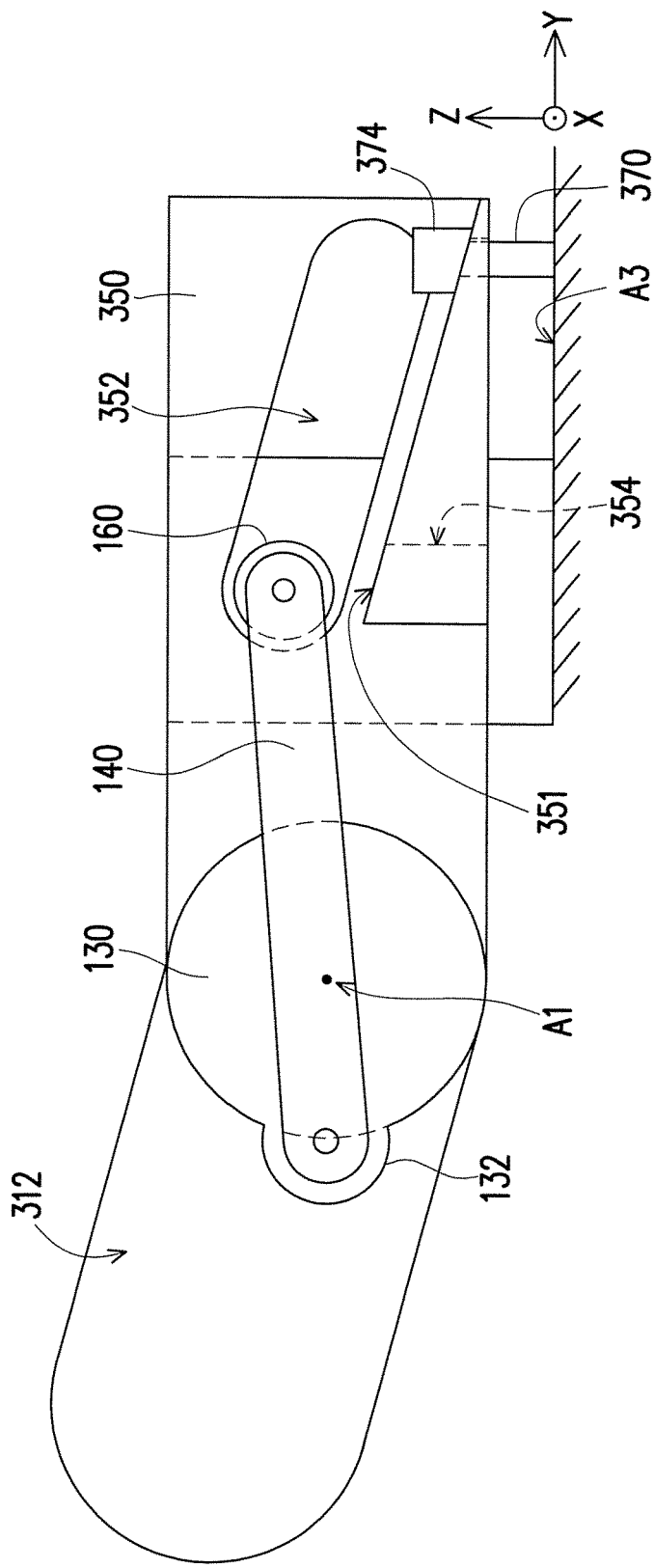
FIG. 7 is equivalent schematic view of an axle structure of a portable electronic device according to yet another embodiment of the disclosure.

FIG. 7 is equivalent schematic view of an axle structure of a portable electronic device according to yet another embodiment of the disclosure. The differences between the present embodiment and the embodiment in FIGS. 5-6 are described as followings. The moving member 350 of the present embodiment has an inclined surface 351 located at the periphery of the second guiding slot 354 and pressing the top blocker 374, and a slope of the inclined surface 351 with respect to a reference surface A4 of the first body is equal to a slope of the extending direction of the reaming hole 312 with respect to the reference surface A4 and is also equal to a slope of the extending direction of the first guiding slot 352 with respect to the reference surface A4. Therefore, the contact area of the moving member 350 and the second stationary axle 370 is increased by providing the inclined surface 351. Additionally, in the unfolded process of the bodies, the moving member 350 is more stable when being lifted. Similarly, in the embodiments of FIGS. 5-7, the second body is unfolded (opened) and simultaneously lifted relative to the first body, so the air flow blown by the fan through the outlets is more likely unimpeded, so as to increase the heat dissipation efficiency.

In summary, in the portable electronic device of the embodiments of the disclosure, the rotating shaft of the second body is movably coupled to the reaming hole of the first body in a pivoting manner, and the cam and one end of the linking rod are further assembled to the side surface of the rotating shaft. Simultaneously, another end of the linking rod is pivoted to a stationary part of the first body. Accordingly, when the second body is pivoted relative to the first body via the rotating shaft, one end of the linking rod pivoted to the cam moves along with the cam, and another end of the linking rod pivoted to the stationary part of the first body is unable to move. Therefore, the first body and the second body are moved relative to each other via moving the rotating shaft or pivoting the second body. In addition, the bodies in the portable electronic device are simultaneously pivoted and moved relative to each other, so as to achieve appearance change and incorporate corresponding functions.

Moreover, in different the embodiments, because the designs of the slopes of the reaming hole, the first guiding slot, and the moving member with respect to the plane, which the second guiding slot and the top blocker supported by, are changed, so that the second body and the rotating shaft are pivoted and simultaneously lifted relative to the first body so as to change the appearance. Therefore, the flexibility of the bodies in the portable electronic device may be increased to attract the user's attention.

Although the disclosure has been disclosed with reference to the aforesaid embodiments, they are not intended to limit the invention. It will be apparent to one of ordinary skill in the art that modifications and variations to the described embodiments may be made without departing from the spirit and the scope of the disclosure. Accordingly, the scope of the disclosure will be defined by the attached claims and not by the above detailed descriptions.

What is claimed is:

1. A portable electronic device, comprising: a first body, having a reaming hole; a second body, having a rotating shaft movable coupled to the reaming hole in a pivoting and a penetrating manner; a cam, assembled to a side surface of the rotating shaft to rotate along with the rotating shaft coaxially; a linking rod, having a first end and a second end opposite to each other, the first end being pivoted to the cam, and the second end being pivoted to the first body, wherein when the second body is pivoted relative to the first body via the rotating shaft, the cam rotates along with the rotating shaft and the linking rod drives the cam and the rotating shaft to move along the reaming hole so as to move the second body towards or away from the first body; and wherein a moving member, fixed to the rotating shaft and located inside the first body, the moving member having a first guiding slot; and a first stationary axle, fixed inside the first body, the second end of the linking rod being pivoted to the first stationary axle, and the first stationary axle and the first guiding slot being movably coupled to each other, wherein an extending direction of the first guiding slot and an extending direction of the reaming hole are identical, so as to make the moving member able to move relative to the first body.

2. The portable electronic device as recited in claim 1, wherein the moving member further has a second guiding slot, the portable electronic device further comprises a second stationary axle fixed to the first body, the second guiding slot and the second stationary axle are movably coupled to each other, an extending direction of the second guiding slot and the extending direction of the first guiding slot are identical, and the second stationary axle is orthogonal to the first stationary axle.

3. The portable electronic device as recited in claim 2, wherein the second stationary axle has a top blocker pressing onto a portion of the moving member at the second guiding slot.

4. The portable electronic device as recited in claim 3, wherein the moving member has an inclined surface located at a periphery of the second guiding slot and pressing the top blocker, a slope of the inclined surface with respect to a reference surface of the first body is equal to a slope of the extending direction of the reaming hole with respect to the reference surface and is equal to a slope of the extending direction of the first guiding slot with respect to the reference surface.

5. The portable electronic device as recited in claim 1, wherein the extending direction of the reaming hole and the extending direction of the first guiding slot has a same slope with respect to a reference surface of the first body, so that when the second body is unfolded from the first body, the second body is lifted relative to the reference surface.

6. The portable electronic device as recited in claim 1, wherein the first end is pivoted to a convex portion of the cam, when the second body is folded to the first body, an axis of the rotating shaft is located between the first end and the second end, when the second body is unfolded from the first body, the first end is located between the axis of the rotating shaft and the second end.

7. The portable electronic device as claimed in claim 1, further comprising:
a fan, disposed inside the first body, a side surface of the first body has a plurality of outlets, a side portion of the second body and the fan are corresponding to each other and separated by the side surface of the first body, when the second body is folded to the first body, the plurality of outlets are adjacent to the side portion, when the second body is unfolded from the first body, a gap is maintained between the plurality of outlets and the side portion.

* * * * *